(12) United States Patent
Nagy et al.

(10) Patent No.: US 11,842,262 B2
(45) Date of Patent: *Dec. 12, 2023

(54) TECHNIQUES FOR ANALYZING VEHICLE DESIGN DEVIATIONS USING DEEP LEARNING WITH NEURAL NETWORKS

(71) Applicant: AUTODESK, INC., San Francisco, CA (US)

(72) Inventors: Danil Nagy, New York, NY (US); Daniel Noviello, London (GB); James Stoddart, Atlanta, GA (US); David Benjamin, Brooklyn, NY (US); Damon Lau, New York, NY (US)

(73) Assignee: AUTODESK, INC., San Francisco, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/045,809

(22) Filed: Oct. 11, 2022

(65) Prior Publication Data
US 2023/0061993 A1    Mar. 2, 2023

Related U.S. Application Data

(63) Continuation of application No. 16/362,555, filed on Mar. 22, 2019, now Pat. No. 11,468,292.

(Continued)

(51) Int. Cl.
*G06N 3/04* (2023.01)
*G06N 3/045* (2023.01)
(Continued)

(52) U.S. Cl.
CPC .............. *G06N 3/045* (2023.01); *G06F 17/15* (2013.01); *G06F 30/15* (2020.01); *G06N 3/08* (2013.01)

(58) Field of Classification Search
CPC ........ G06N 3/0454; G06N 3/08; G06F 30/15; G06F 17/15
(Continued)

(56) References Cited

U.S. PATENT DOCUMENTS 11,163,308 B2 *  11/2021  Alawieh .............. G05D 1/0231
11,468,292 B2 * 10/2022  Nagy .................... G06N 3/045
(Continued)

OTHER PUBLICATIONS

Pan et al., "A Quantitative Model for Identifying Regions of Design Visual Attraction and Application to Automobile Styling", International Design Conference—Design, Industrial Design, May 16-19, 2016, pp. 2157-2166.

(Continued)

*Primary Examiner* — Emmanuel Bayard
(74) *Attorney, Agent, or Firm* — Artegis Law Group, LLP

(57) ABSTRACT

A design application is configured to generate a latent space representation of a fleet of pre-existing vehicles. The design application encodes vehicle designs associated with the fleet of pre-existing vehicles into the latent space representation to generate a first latent space location. The first latent space location represents the characteristic style associated with the fleet of pre-existing vehicles. The design application encodes a sample design provided by a user into the latent space representation to produce a second latent space location. The design application then determines a distance between the first latent space location and the second latent space location. Based on the distance, the design application generates a style metric that indicates the aesthetic similarity between the sample design and the vehicle designs associated with the fleet of pre-existing vehicles. The design application can also generate new vehicle designs based on the latent space representation and the sample design.

24 Claims, 5 Drawing Sheets

Related U.S. Application Data

(60) Provisional application No. 62/668,731, filed on May 8, 2018.

(51) Int. Cl.
*G06F 17/15* (2006.01)
*G06N 3/08* (2023.01)
*G06F 30/15* (2020.01)

(58) Field of Classification Search
USPC .............................................. 375/224; 706/15
See application file for complete search history.

(56) References Cited

U.S. PATENT DOCUMENTS

| 2005/0125193 | A1* | 6/2005 | Kling, III | ................. | G06T 7/70 |
| | | | | | 702/150 |
| 2009/0077672 | A1 | 3/2009 | Gold | | |
| 2010/0082212 | A1 | 4/2010 | Miyajima et al. | | |
| 2021/0312810 | A1* | 10/2021 | Golgiri | ................. | G08G 1/017 |

OTHER PUBLICATIONS

Hyun et al., "Style synthesis and analysis of car designs for style quantification based on product appearance similarities", Adavnces Engineering Informatics, vol. 29, No. 3, Aug. 1, 2015, pp. 483-494.

Tan et al., "Using Interactive Genetic Algorithm to Generate New Vehicle Styling Brand Elements with Feature Lines A Case Study of Micro-car Design in China", Proceedings 5th International Congress of International Association of Societies of Design Research, Aug. 26, 2013, pp. 1-12.

Li et al., "A machine learning-based framework for analyzing car brand styling", Advances in Mechanical Engineering, vol. 10, No. 7, Jul. 1, 2018, pp. 1-17.

* cited by examiner

TECHNIQUES FOR ANALYZING VEHICLE DESIGN DEVIATIONS USING DEEP LEARNING WITH NEURAL NETWORKS

CROSS-REFERENCE TO RELATED APPLICATIONS

This application claims benefit of United States Patent Application titled "TECHNIQUES FOR ANALYZING VEHICLE DESIGN DEVIATIONS USING DEEP LEARNING WITH NEURAL NETWORKS," Ser. No. 16/362,555, filed Mar. 22, 2019, which claims priority benefit of the United States Provisional Application titled "TECHNIQUES FOR ANALYZING AUTOMOBILE DESIGN DEVIATIONS USING DEEP LEARNING WITH NEURAL NETWORKS," filed May 8, 2018, and having Ser. No. 62/668,731. The subject matter of these related applications is hereby incorporated herein by reference.

BACKGROUND

Field of the Various Embodiments

Embodiments of the present invention relate generally to computer science and, more specifically, to techniques for analyzing vehicle design deviations using deep learning with neural networks.

Description of the Related Art

In a typical vehicle design workflow, a designer generates new designs for vehicles when expanding or modifying the types of vehicles available in an existing fleet of vehicles associated with a vehicle manufacturer. Oftentimes each vehicle included in the existing fleet of vehicles is designed based on a characteristic style that represents various aesthetic qualities that distinguish that particular vehicle manufacturer from other vehicle manufacturers. When generating a new vehicle design, the designer usually incorporates those aesthetic qualities into the new design in order to remain consistent with the overall characteristics and styles associated with the existing fleet of vehicles. Accordingly, vehicles that are manufactured based on the new design can be added to the existing fleet of vehicles without disrupting or diverging significantly from the characteristics and styles associated with that fleet of vehicles.

One drawback of the above approach is that certain types of vehicles have to include specific features that may not appear aesthetically consistent with the characteristics and styles associated with an existing fleet of vehicles. Consequently, in such situations, designers can have difficulty generating new designs for vehicles that can readily be introduced into the relevant existing fleet of vehicles. For example, autonomous vehicles usually need to include one or more bulky, external sensor arrays in order to accurately map the environment surrounding the autonomous vehicle when performing autonomous navigation. The bulky sensor array(s) could cause the autonomous vehicle to have an awkward style that is quite different from the characteristics and styles associated with the relevant existing fleet of vehicles. To address this issue, designers usually have to generate numerous designs and then subjectively evaluate, based on experience and intuition, how closely each design adheres to the desired characteristics and style. However, evaluating each design in this manner can be very time consuming and cannot be performed in an objective and/or deterministic manner.

As the foregoing illustrates, what is needed in the art is a more effective technique for generating new vehicle designs for an existing fleet of vehicles.

SUMMARY

Various embodiments include a computer-implemented method for analyzing vehicle designs, including encoding a first vehicle design into a first location within a latent space representation of vehicle design features, encoding a second vehicle design into a second location within the latent space representation, and generating a first metric based on the first location and the second location, wherein the first metric indicates a degree to which the first vehicle design differs from a characteristic style associated with the second vehicle design.

At least one technological advantage of the disclosed techniques relative to the prior art is that the degree to which a vehicle design diverges from or converges towards a set of particular characteristics and styles can be quantifiably determined. Accordingly, new vehicle designs that include new design features can be analyzed to identify which designs most closely align with the characteristics and styles associated with a fleet of existing vehicles.

BRIEF DESCRIPTION OF THE DRAWINGS

So that the manner in which the above recited features of the various embodiments can be understood in detail, a more particular description of the inventive concepts, briefly summarized above, may be had by reference to various embodiments, some of which are illustrated in the appended drawings. It is to be noted, however, that the appended drawings illustrate only typical embodiments of the inventive concepts and are therefore not to be considered limiting of scope in any way, and that there are other equally effective embodiments.

DETAILED DESCRIPTION

Figure 1:
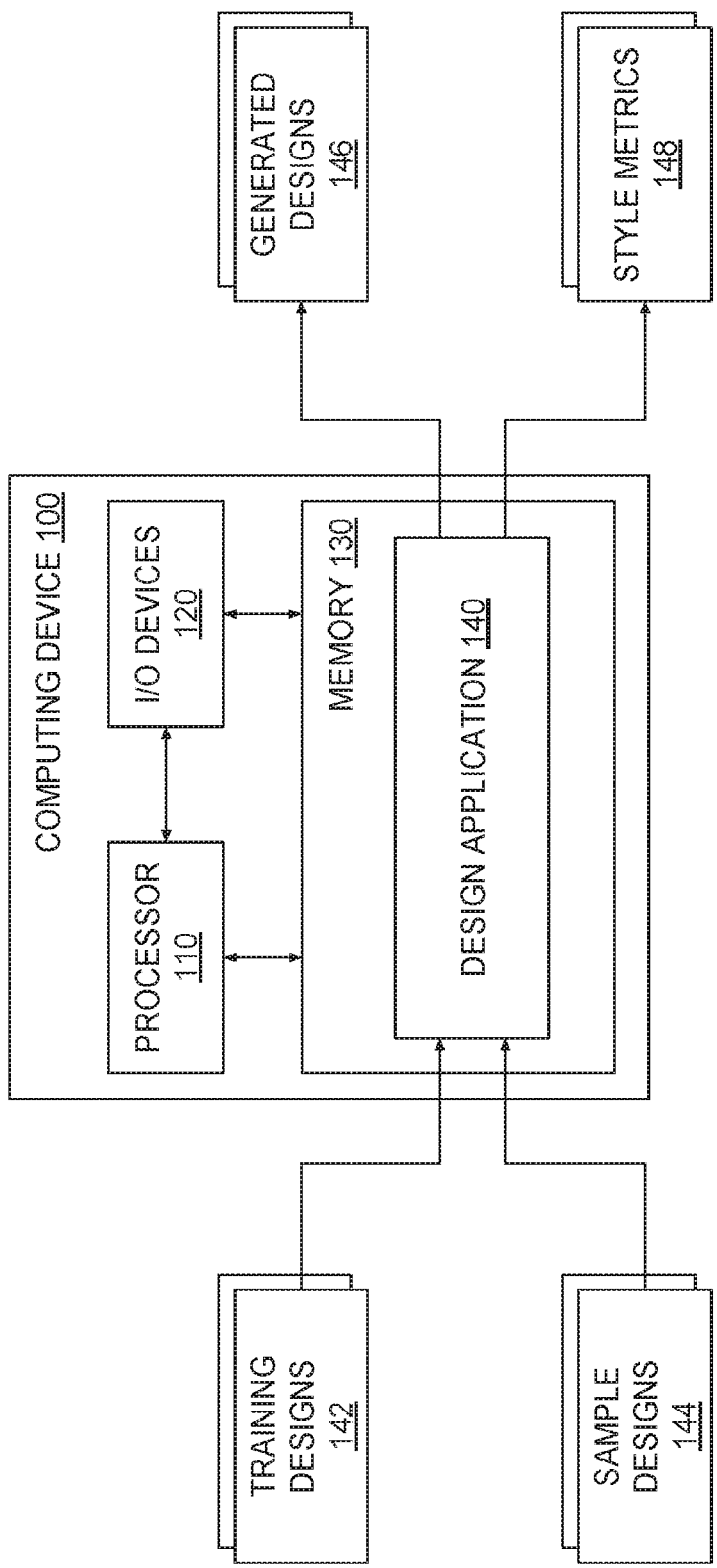
FIG. 1 illustrates a computing device configured to implement one or more aspects of the present invention.

In the following description, numerous specific details are set forth to provide a more thorough understanding of the various embodiments. However, it will be apparent to one skilled in the art that the inventive concepts may be practiced without one or more of these specific details.

As noted above, in a typical vehicle design workflow, a designer generates vehicle designs to conform with a characteristic style that is derived from a fleet of pre-existing vehicles. However, some types of vehicles have to include specific physical features that can cause the appearance of those vehicles to diverge from that characteristic style. For example, autonomous vehicles oftentimes have to include various types of sensors that can cause the appearance of those vehicles to depart from any given characteristic style.

Accordingly, what would be useful is a technique for rating newly generated vehicle designs to quantify how similar those designs are, from an aesthetic standpoint, to a fleet of pre-existing vehicles. What would be further useful is a technique for automatically generating vehicle designs that appear aesthetically consistent with the characteristic style associated with a fleet of pre-existing vehicles, yet also include any needed design features.

In view of the foregoing, various embodiments include a design application that is configured to generate a latent space representation of a fleet of pre-existing vehicles. The design application includes an encoder model that encodes vehicle designs into the latent space representation. The design application further includes a generator model that decodes positions in the latent space representation to generate vehicle designs.

The design application encodes vehicle designs associated with the fleet of pre-existing vehicles into the latent space representation to generate a first latent space location. The first latent space location represents the characteristic style associated with the fleet of pre-existing vehicles. The design application encodes a sample design provided by a user into the latent space representation to produce a second latent space location. The design application then determines a distance between the first latent space location and the second latent space location. Based on the distance, the design application generates a style metric that indicates the aesthetically similarity between the sample design and the vehicle designs associated with the fleet of pre-existing vehicles.

The design application can also traverse the latent space representation from the second latent space location associated with the sample design towards the first latent space location associated with the training designs to generate one or more additional locations in the latent space representation. The generator model can then generate new designs based on those additional locations. The newly-generated designs may have a characteristic style that aligns with the characteristic style of the fleet of pre-existing vehicles. The encoder model and the generator model can be trained using a variety of Machine Learning techniques, including those associated with deep convolutional neural networks and generative adversarial networks, among others.

At least one technological advantage of the disclosed techniques relative to the prior art is that the degree to which a vehicle design diverges or converges to a particular characteristic style can be quantifiably determined. Accordingly, vehicle designs that have to include specific design features can be analyzed to identify the specific vehicle designs that most closely align with the characteristic style associated with the fleet of pre-existing vehicles yet still include the needed design features. In addition, the latent space representation allows new vehicle designs to be generated that more closely match that characteristic style compared to the vehicle designs provided by the user. These techniques are especially useful for designing autonomous vehicles that need to include specific design features associated with autonomous navigation yet also need to conform to the characteristic style associated with the fleet of pre-existing vehicles. Accordingly, these technological advantages represent multiple technological advancements relative to prior art approaches.

System Overview

FIG. 1 illustrates a computing device configured to implement one or more aspects of the present invention. As shown, a computing device 100 includes a processor 110, input/output (I/O) devices 120, and a memory 130, coupled together. Processor 110 includes any technically feasible set of hardware units configured to process data and execute software applications. For example, processor 110 could include one or more central processing units (CPUs). I/O devices 120 include any technically feasible set of devices configured to perform input and/or output operations, including, for example, a display device, a keyboard, and a touchscreen, among others. Memory 130 includes any technically feasible storage media configured to store data and software applications, such as, for example, a hard disk, a random-access memory (RAM) module, and a read-only memory (ROM).

Memory 130 stores a design application 140 that, when executed by processor 110, performs various operations associated with a vehicle design workflow. In particular, design application 140 analyzes training designs 142 associated with a fleet of pre-existing vehicles and generates a latent space representation (not shown here) corresponding to those training designs. The latent space representation can be used to produce generated designs 146 that may appear visually similar and/or stylistically consistent with training designs 142.

The latent space representation can also be used to analyze sample designs 144 obtained from a user to generate style metrics 148. Style metrics 148 indicate how closely sample designs 144 align with a characteristic style associated with training designs 142. Design application 140 can process style metrics 148 to produce additional generated designs 146 that may be similar to sample designs 144, yet also adhere to the characteristic style associated with training designs 142.

Training designs 142, sample designs 144, and generated designs 148 can be implemented via any technically feasible data structure. For example, any of these designs could be implemented via a set of pixels, a vectorized image, a set of non-uniform rational B-spline (NURBS) curves, one or more two-dimensional (2D) models, one or more (3D) three-dimensional models, and so forth.

Design application 140 includes various engines that are configured to implement the different operations described above, as described in greater detail below in conjunction with FIGS. 2A-2B.

Analyzing Vehicle Design Deviations

Figure 2A:
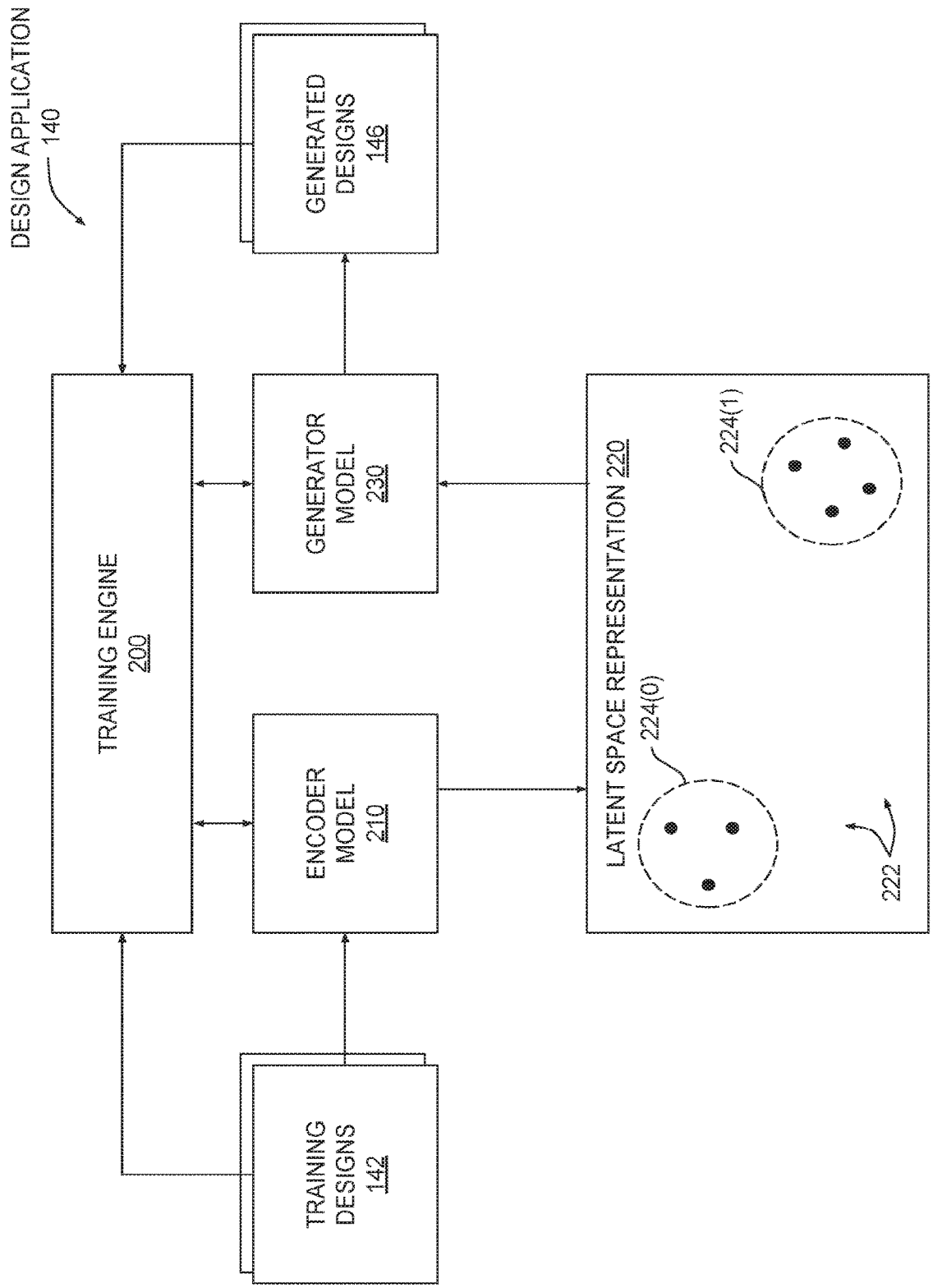
FIG. 2A illustrates how the design application of FIG. 1 generates a latent space representation of vehicle design features, according to various embodiments of the present invention.

FIG. 2A illustrates how the design application of FIG. 1 generates a latent space representation of vehicle design features, according to various embodiments of the present invention. As shown in FIG. 2A, design application 140 includes a training engine 200, an encoder model 210, a latent space representation 220, and a generator model 230. Encoder model 210 and generator model 230 are Machine Learning data structures that can be modified by training engine 200 during a training procedure. For example, encoder model 210 and generator model 230 could be deep convolutional neural networks. In one embodiment, encoder model 210 may perform convolutional operations, while generator model 230 may perform deconvolutional operations.

In operation, training engine 200 trains encoder model 210 to encode training designs 142 and other designs into the latent space representation 220. Latent space representation 220 is a low-dimensional construct where encoder model 210 can project higher-dimensional constructs, including training designs 142 and other designs, to specific low-dimensional locations within latent space representation 220.

To project a given training design 142 to a specific location in latent space representation 220, encoder model 210 performs an iterative process to reduce the dimensionality associated with the given training design 142 until that dimensionality equates to the dimensionality of latent space representation 220. The reduced-dimensionality version of the given training design 142 then directly corresponds to a location within latent space representation 220. For example, latent space representation 220 could be a 2D data structure, and encoder model 210 could reduce the dimensionality of the given training design 142 to produce a set of 2D Cartesian coordinates corresponding to a location within latent space representation 220. In one embodiment, encoder model 210 may reduce the dimensionality of the given training design 142 via a convolution operation.

In the example shown in FIG. 2A, latent space representation 220 includes latent space locations 222 that correspond to different training designs 142. A group 224(0) of latent space locations corresponds to a specific set of training designs 142, while a group 224(1) of latent space locations corresponds to a different set of training designs 142. As known to those familiar with latent space representations, locations in a latent space representation that are proximate to one another generally correspond to similar inputs, while locations in the latent space representation that are distant from one another generally correspond to dissimilar inputs. Accordingly, training designs 142 associated with group 224(0) of latent space locations are generally similar to one another and training designs 142 associated with group 224(1) of latent space locations are likewise similar to one another. However, training designs 142 associated with group 224(0) of latent space locations are generally dissimilar from training designs 142 associated with group 224(1) of latent space locations.

In conjunction with training encoder model 210, as discussed above, training engine 200 also trains generator model 230 to produce generated designs 146 based on latent space representation 220. To produce a generated design 146 based on a given latent space location, generator model 230 performs an iterative process to increase the dimensionality associated with the latent space location to a higher dimensionality. Generator model 230 can increase the dimensionality associated with the latent space location to match the dimensionality associated with training image 142, or increase the dimensionality further when trained via an additional technique described in greater detail below in conjunction with FIG. 3. In this manner, generator model 230 can "unpack" latent space locations to produce generated designs 146.

During training, training engine 200 modifies a set of weight values associated with encoder model 210 in order to improve how accurately latent space representation 220 can represent training designs 142. Training engine 200 also modifies a set of weight values associated with generator model 230 to improve how closely at least some of generated designs 146 correspond to training designs 142. For example, during a given training iteration, training engine 200 could cause encoder model 210 to encode a first training design 142 to a first latent space location. Training engine 200 could also cause generator model 230 to produce a first generated design 146 based on the first latent space location. Training engine 200 would then compare the first training design 142 to the first generated design 146 and modify the set(s) of weight values associated with encoder model 210 and/or generator model 230 in order to reduce one or more differences between the first training design 142 and the first generated design 146. As mentioned above, FIG. 3 sets forth an additional training technique that can augment the above process.

Once training engine 200 generates encoder model 210, latent space 220, and generator model 230 in the manner described, design application 140 can implement a navigation engine in order to navigate latent space representation 220 and quantify the degree to which a given sample design 144 complies with a particular characteristic style, as described in greater detail below in conjunction with FIG. 2B.

Figure 2B:
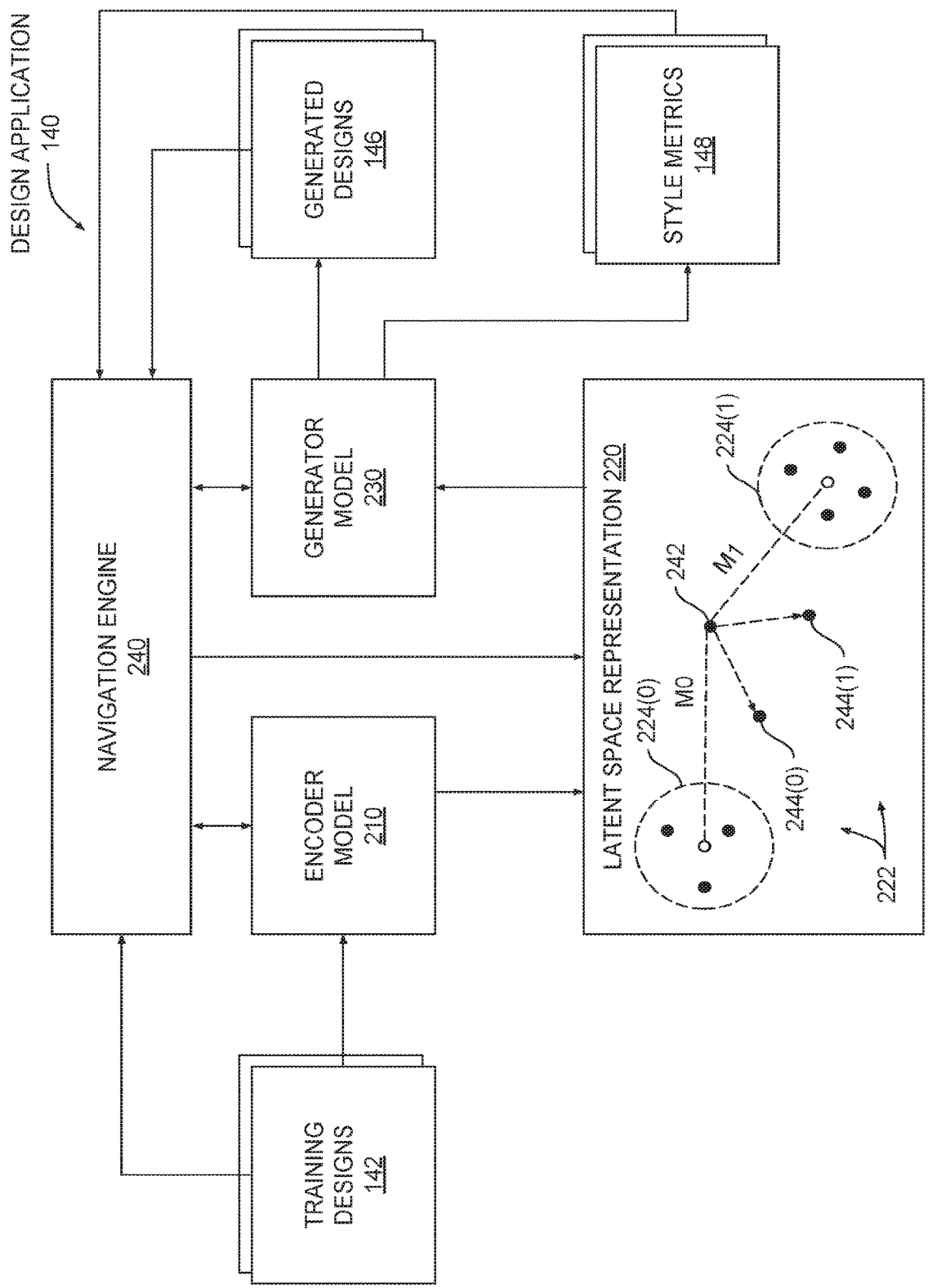
FIG. 2B illustrates how the design application of FIG. 1 navigates the latent space representation of FIG. 2A, according to various embodiments of the present invention.

FIG. 2B illustrates how the design application of FIG. 1 navigates the latent space representation of FIG. 2A, according to various embodiments of the present invention. As shown, design application 140 includes a navigation engine 240. Training engine 200 is omitted for clarity. In addition, latent space representation 220 includes a latent space location 242. Encoder model 210 generates latent space location 242 by projecting a sample design 244 that is provided by a user into latent space representation 220. In doing so, encoder model 210 reduces the dimensionality associated with the sample design 144 to that associated with latent space representation 220 in the manner described above in conjunction with FIG. 2A.

Once the sample design 144 is projected to latent space location 242, navigation engine 240 determines that latent space location 242 resides a distance M0 from a centroid associated with group 224(0) of latent space locations and resides a distance M1 from a centroid associated with group 224(1) of latent space locations. The distances M0 and M1 quantify the similarity between the sample design 144 and training designs 142 used to generate groups 224(0) and 224(1). Navigation engine 240 generates style metrics 148 based on distances M0 and M1 to quantify how well the sample design 144 approximates a characteristic style associated with those training designs 142. In this manner, navigation engine 240 can automatically evaluate a design relative to many other designs in order to determine whether that design diverges from, or converges to, a given characteristic style.

Navigation engine 240 can also generate new designs based on the sample design 144 that may, in some cases, better comply with a given characteristic style. In particular, navigation engine 240 can generate latent space locations 244(0) and/or 244(1) that reside closer to groups 224(0) and 224(1), respectively, within latent space representation 220. Generator model 230 can then produce generated designs 146 based on latent space locations 244. These generated designs 146 are derived from the sample design 144 but may be more stylistically consistent with the training designs 142 used to generate groups 224(0) and 224(1). Accordingly, navigation engine 240 facilitates the generation of designs that do not significantly diverge from a particular characteristic style.

Referring generally to FIGS. 2A-2B, in one mode of operation, encoder model 210 encodes designs having a first resolution and generator model 230 generates designs at that same resolution. However, in another mode of operation, training engine 200 can implement a specific technique when training generator model 230 in order to increase the resolution with which generator model 230 generates designs, as described in greater detail below in conjunction with FIG. 3.

Figure 3:
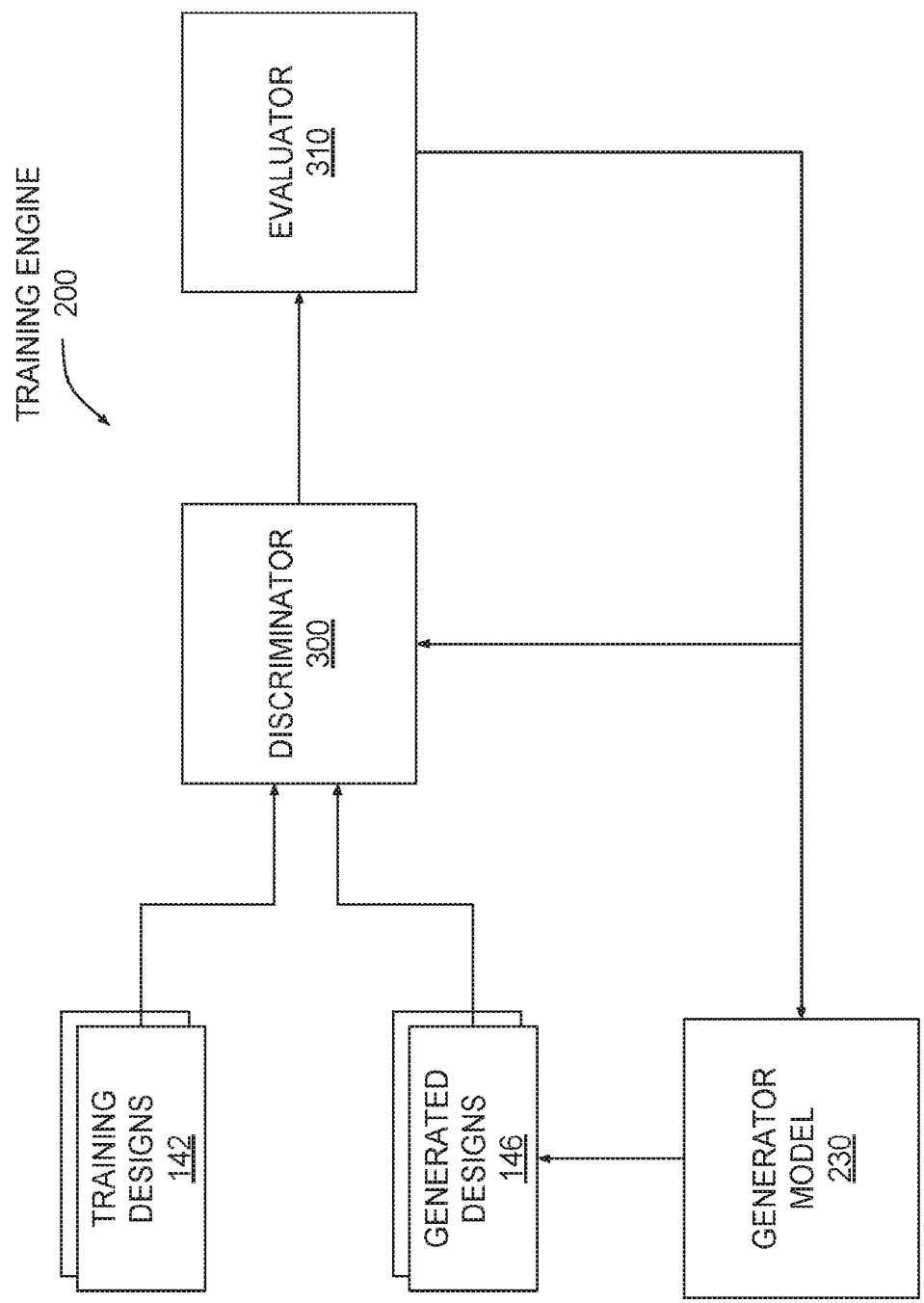
FIG. 3 is a more detailed illustration of the training engine of FIG. 2A, according to various embodiments of the present invention.

FIG. 3 is a more detailed illustration of the training engine of FIG. 2A, according to various embodiments of the present invention. As shown, training engine 200 includes a discriminator 300 and an evaluator 310. Discriminator 300 and evaluator 310 may be included in a generative adversarial network (GAN). In operation, discriminator 300 receives training designs 142 and generated designs 146 and then attempts to discriminate training designs 142 from generated designs 146. Evaluator 310 then determines whether discriminator 300 can correctly discriminate between the two types of designs. Based on how well discriminator 300 performs, evaluator 310 modifies discriminator 300 to discriminate more accurately. Evaluator 310 also modifies generator model 230 to generate more accurate and higher resolution generated designs 146. Persons familiar with GANs will understand how discriminator 300 and evaluator 310 can improve the training of generator module 230.

Referring generally to FIG. 1-3, the techniques described above advantageously relieve the designer from having to manually evaluate new vehicle designs to determine whether those designs are aesthetically consistent with a characteristic style associated with a fleet of pre-existing vehicles. Accordingly, the designer can more quickly validate that any given vehicle design does not significantly diverge from that characteristic style. In addition, the disclosed techniques facilitate the generation of new designs that may have to include certain features yet nonetheless need to comply with a given characteristic style. Therefore, the disclosed techniques are especially useful when applied to the design of autonomous vehicles that often need to include external components, such as sensors, but still need to remain stylistically consistent with one or more other vehicles.

Figure 4:
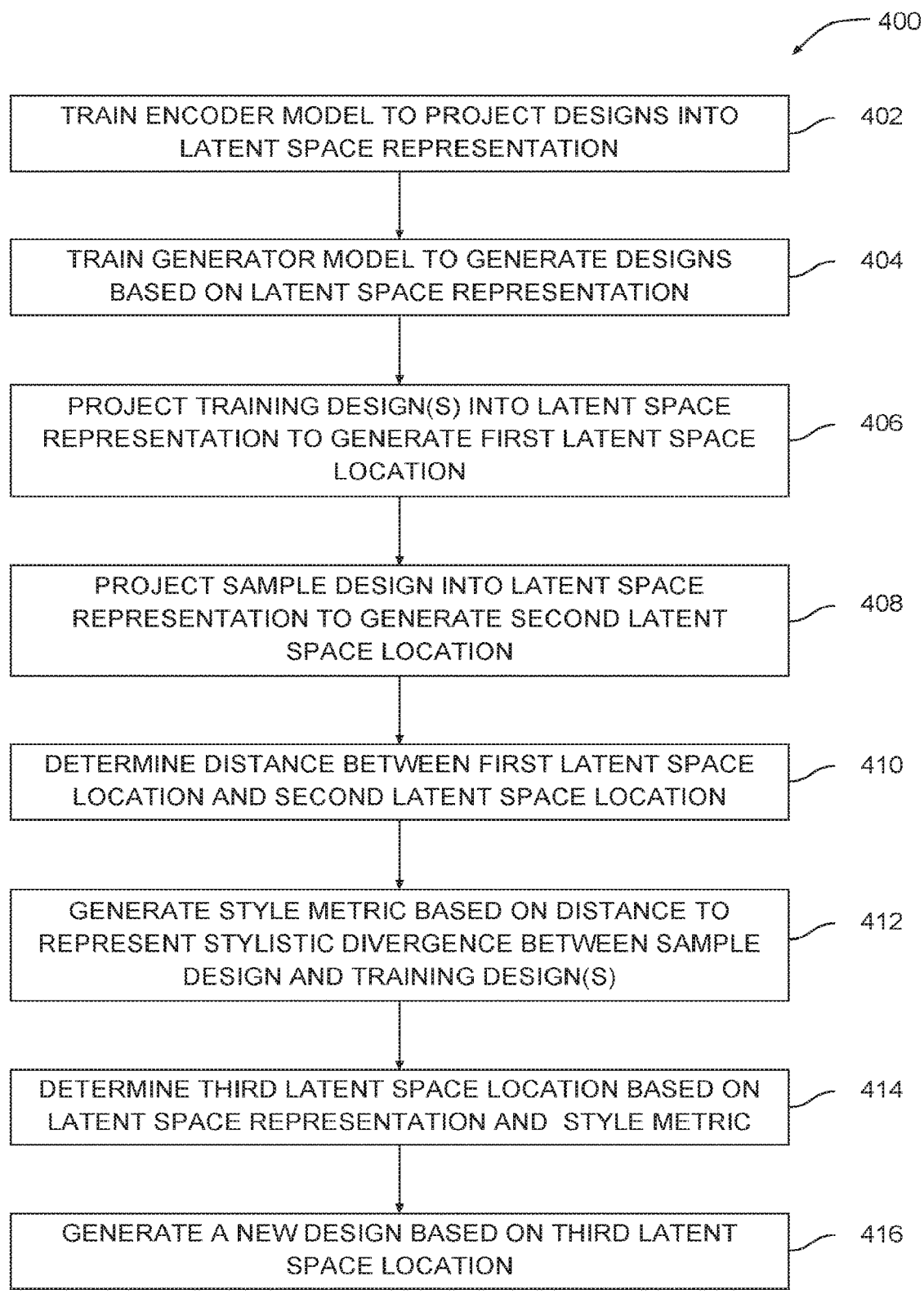
FIG. 4 is a flow diagram of method steps for automatically generating designs that have characteristics and styles similar to those of existing designs, according to various embodiments of the present invention.

FIG. 4 is a flow diagram of method steps for automatically generating designs that have characteristics and styles similar to those of existing designs, according to various embodiments of the present invention. Although the method steps are described in conjunction with the systems of FIGS. 1-3, persons skilled in the art will understand that any system configured to perform the method steps in any order falls within the scope of the present invention.

As shown, a method 400 begins at step 402, where training engine 200 of FIG. 2A trains encoder model 210 to project designs into latent space representation 220. Latent space representation 220 is a low-dimensional construct where encoder model 210 can project higher-dimensional constructs, including training designs 142 and other designs, to specific low-dimensional locations within latent space representation 220. In one embodiment, encoder model 210 may be a convolutional neural network that performs convolution operations to reduce the dimensionality associated with designs to the dimensionality associated with locations within latent space representation 220.

At step 404, training engine 200 trains generator mode 2301 to generate designs based on latent space representation 220. Training engine 200 modifies a set of weight values associated with generator model 230 to cause generator model 230 to accurately re-create training designs 142 that encoder model 210 encodes into latent space representation 220. In one embodiment, training engine 200 may implement elements of a GAN in order to guide the training of generator model 230 to produce higher-resolution designs, as described above in conjunction with FIG. 3. Generator model 230 generates a given design by increasing the dimensionality associated with a location in latent space representation 220 to that associated with training designs 142 or to a higher dimensionality associated with higher-resolution designs. In one embodiment, generator model 230 is a deconvolutional neural network that is trained in conjunction with encoder model 210.

At step 406, training engine 200 projects one or more training designs 142 into latent space representation 220 to generate a first latent space location. The first latent space location may correspond to a centroid associated with a group of latent space locations generated based on training designs 142. For example, the first latent space location could be latent space location 224(0) shown in FIGS. 2A-2B. As a general matter, latent space locations that reside proximate to the first latent space location correspond to designs that have similar features, similar aesthetics, and/or similar design characteristics.

At step 408, navigation engine 240 of FIG. 2B projects a sample design 144 into latent space representation 220 to generate a second latent space location. In doing so, navigation engine 240 causes encoder model 210 to reduce the dimensionality associated with the sample design 144 to that associated with latent space representation 220. Latent space locations that reside proximate to the second latent space location generally correspond to designs that have one or more design characteristics in common with the sample design 144.

At step 410, navigation engine 240 determines the distance between the first latent space location and the second latent space location. In one embodiment, latent space representation is a 2D data structure and distances across latent space representation 220 can be quantified using a 2D Euclidean distance formula. The distance between any two latent space locations generally quantifies a stylistic difference between any corresponding two designs.

At step 412, navigation engine 240 generates a style metric based on the distance generated at step 410 to represent any stylistic divergence between the sample design 144 and the training design(s) 142. The style metric can be computed using a variety of different techniques. For example, navigation engine 240 could normalize the distance generated at step 410 to generate the style metric. Alternatively, navigation engine 240 could weight the distance generated at step 410 based on different weightings assigned to specific regions of latent space representation 220. One advantage of generating the style metric in the manner described is that a user of design application 140 can quantify how closely new designs align with the characteristic style associated with a fleet of pre-existing vehicles, thereby easing the burden of manually evaluating numerous new designs.

At step 414, navigation engine 240 determines a third latent space location based on latent space representation 220 and based on the style metric generated at step 412. For example, navigation engine 240 could determine that the style metric indicates an unacceptable divergence from the characteristic style associated with training designs 142. Navigation engine 240 could then traverse latent space representation 220 from the second latent space location towards the first latent space location. Navigation engine 240 can traverse latent space representation 220 a distance that depends on the level of divergence indicated by the style metric. For example, navigation engine 240 could traverse a short distance towards the first latent space location when the style metric does not indicate excessive stylistic divergence, and traverse a longer distance when the style metric does indicate excessive stylistic divergence.

At step 416, navigation engine 240 causes generator model 230 to generate a new design based on the third latent space location. Generator model 230 "unpacks" the third latent space location by increasing the dimensionality associated with that location to be equal to or greater than the dimensionality associated with the sample design 144. One advantage of the technique described above is that sample designs 144 that include bulky or awkward features, such as those commonly associated with autonomous vehicles, can be modified to more closely adhere to the characteristic style associated with a fleet of pre-existing vehicles.

In sum, a design application is configured to generate a latent space representation of a fleet of pre-existing vehicles. The design application includes an encoder model that encodes vehicle designs into the latent space representation. The design application further includes a generator model that decodes positions in the latent space representation to generate vehicle designs. The design application encodes vehicle designs associated with the fleet of pre-existing vehicles into the latent space representation to generate a first latent space location. The first latent space location represents the characteristic style associated with the fleet of pre-existing vehicles. The design application encodes a sample design provided by a user into the latent space representation to produce a second latent space location. The design application then determines a distance between the first latent space location and the second latent space location. Based on the distance, the design application generates a style metric that indicates the aesthetic similarity between the sample design and the vehicle designs associated with the fleet of pre-existing vehicles.

The design application can also traverse the latent space representation from the second latent space location associated with the sample design towards the first latent space location associated with the training designs to generate one or more additional locations in the latent space representation. The generator model can then generate new designs based on those additional locations. The newly-generated designs may have a characteristic style that aligns with the characteristic style of the fleet of pre-existing vehicles. The encoder model and the generator model can be trained using a variety of Machine Learning techniques, including those associated with deep convolutional neural networks and generative adversarial networks, among others.

At least one technological advantage of the disclosed techniques relative to the prior art is that the degree to which a vehicle design diverges from or converges towards a set of particular characteristics and styles can be quantifiably determined. Accordingly, new vehicle designs that include new design features can be analyzed to identify which designs most closely align with the characteristics and styles associated with a fleet of existing vehicles. Another technological advantage is that the latent space representation of vehicle design features allows new vehicle designs to be generated automatically that closely match the characteristics and styles associated with a fleet of existing vehicles. These automated design techniques are especially useful when designing autonomous vehicles that have to include certain design features necessary for autonomous navigation, but also need to have characteristics and styles that conform to those associated with the relevant fleet of existing vehicles. These technological advantages represent at least one technological advancement relative to prior art approaches.

1. Some embodiments include a computer-implemented method for analyzing vehicle designs, the method comprising encoding a first vehicle design into a first location within a latent space representation of vehicle design features, encoding a second vehicle design into a second location within the latent space representation, and generating a first metric based on the first location and the second location, wherein the first metric indicates a degree to which the first vehicle design differs from a characteristic style associated with the second vehicle design.

2. The computer-implemented method of clause 1, further comprising generating a third vehicle design based on the first metric, wherein the third vehicle design includes at least one design feature associated with the characteristic style.

3. The computer-implemented method of any of clauses 1-2, wherein generating the third vehicle design comprises traversing the latent space from the first location to a third location, and increasing a dimensionality associated with the third location to a dimensionality that is greater than or equal to a dimensionality associated with the first vehicle design.

4. The computer-implemented method of any of clauses 1-3, wherein increasing the dimensionality associated with the third location comprises performing a deconvolution operation on the third location.

5. The computer-implemented method of any of clauses 1-4, wherein encoding the first vehicle design comprises decreasing a dimensionality associated with the first vehicle design to a dimensionality that is equal to a dimensionality associated with the latent space.

6. The computer-implemented method of any of clauses 1-5, wherein decreasing the dimensionality associated with the first vehicle design comprises performing a convolution operation on the first vehicle design.

7. The computer-implemented method of any of clauses 1-6, wherein generating the first metric comprises computing a distance value between the first location and the second location.

8. The computer-implemented method of any of clauses 1-7, wherein the first vehicle design comprises a two-dimensional array of pixels.

9. The computer-implemented method of any of clauses 1-8, wherein the first vehicle design comprises a set of non-uniform rational B-spline (NURBS) curves.

10. The computer-implemented method of any of clauses 1-9, further comprising training an encoder network to encode the first vehicle design based on a comparison between the second vehicle design and a third vehicle design.

11. Some embodiments include a non-transitory computer-readable medium storing program instructions that, when executed by a processor, cause the processor to analyze vehicle designs by performing the steps of encoding a first vehicle design into a first location within a latent space representation of vehicle design features, encoding a second vehicle design into a second location within the latent space representation, and generating a first metric based on the first location and the second location, wherein the first metric indicates a degree to which the first vehicle design differs from a characteristic style associated with the second vehicle design.

12. The non-transitory computer-readable medium of clause 11, further comprising the step of generating a third vehicle design based on the first metric, wherein the third vehicle design includes at least one design feature associated with the characteristic style.

13. The non-transitory computer-readable medium of any of clauses 11-12, wherein the step of generating the third vehicle design comprises traversing the latent space from the first location to a third location, and increasing a dimensionality associated with the third location to a dimensionality that is greater than or equal to a dimensionality associated with the first vehicle design.

14. The non-transitory computer-readable medium of any of clauses 11-13, wherein increasing the dimensionality associated with the third location comprises performing a deconvolution operation on the third location.

15. The non-transitory computer-readable medium of any of clauses 11-14, wherein the step of encoding the first vehicle design comprises decreasing a dimensionality associated with the first vehicle design to a dimensionality that is equal to a dimensionality associated with the latent space.

16. The non-transitory computer-readable medium of any of clauses 11-15, wherein decreasing the dimensionality associated with the first vehicle design comprises performing a convolution operation on the first vehicle design.

17. The non-transitory computer-readable medium of any of clauses 11-16, wherein the step of generating the first metric comprises computing a distance value between the first location and the second location.

18. The non-transitory computer-readable medium of any of clauses 11-17, further comprising the steps of training an encoder network to encode the first vehicle design based on a comparison between the second vehicle design and a third vehicle design, and training a generator network to generate a third vehicle design based on a comparison between the first vehicle design and the second vehicle design.

19. The non-transitory computer-readable medium of any of clauses 11-18, wherein the first vehicle design incudes at least one sensor feature associated with an autonomous vehicle.

20. Some embodiments include a system, comprising a memory that stores a software application, and a processor that executes the software application to perform the steps of encoding a first vehicle design into a first location within a latent space representation of vehicle design features, encoding a second vehicle design into a second location within the latent space representation, and generating a first metric based on the first location and the second location, wherein the first metric indicates a degree to which the first vehicle design differs from a characteristic style associated with the second vehicle design.

Any and all combinations of any of the claim elements recited in any of the claims and/or any elements described in this application, in any fashion, fall within the contemplated scope of the present invention and protection.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine. The instructions, when executed via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for generating vehicle designs, the method comprising:
   encoding, using an encoder network, a first vehicle design into a first location within a latent space representation of vehicle design features;
   encoding, using the encoder network, a second vehicle design into a second location within the latent space representation;

generating a first metric based on the first location and the second location, wherein the first metric indicates a degree to which the first vehicle design differs from a characteristic style associated with the second vehicle design;

traversing the latent space representation from the second location towards the first location to a third location in the latent space representation, wherein a distance traversed is determined based on the first metric; and generating, using a generator network, a third vehicle design based on the third location by increasing a dimensionality associated with the third location to another dimensionality that is greater than or equal to a dimensionality associated with the first vehicle design.

2. The computer-implemented method of claim 1, wherein generating the first metric comprises computing a distance value between the first location and the second location.

3. The computer-implemented method of claim 1, wherein the third vehicle design includes at least one design feature associated with the characteristic style.

4. The computer-implemented method of claim 1, wherein increasing the dimensionality associated with the third location comprises performing a deconvolution operation on the third location.

5. The computer-implemented method of claim 1, wherein encoding the first vehicle design comprises decreasing the dimensionality associated with the first vehicle design to a dimensionality that is equal to a dimensionality associated with the latent space representation.

6. The computer-implemented method of claim 5, wherein decreasing the dimensionality associated with the first vehicle design comprises performing a convolution operation on the first vehicle design.

7. The computer-implemented method of claim 1, wherein the first vehicle design comprises a two-dimensional array of pixels.

8. The computer-implemented method of claim 1, wherein the first vehicle design comprises a set of non-uniform rational B-spline (NURBS) curves.

9. The computer-implemented method of claim 1, further comprising performing one or more training operations based on a comparison between different vehicle designs to train the encoder network to project one or more vehicle designs into the latent space representation.

10. The computer-implemented method of claim 1, further comprising training the encoder network to project designs onto the latent space representation.

11. The computer-implemented method of claim 10, further comprising training the generator network to generate designs based on the latent space representation.

12. One or more non-transitory computer-readable media storing instructions that, when executed by one or more processors, cause the one or more processors to perform the steps of:

projecting a first vehicle design into a latent space representation of vehicle design features to generate a first location;

projecting a second vehicle design into the latent space representation to generate a second location;

determining a distance between the first location and the second location;

generating a style metric based on the distance; and generating a third vehicle design based on the style metric.

13. The one or more non-transitory computer-readable media of claim 12, further comprising determining a third location within the latent space representation based on the style metric.

14. The one or more non-transitory computer-readable media of claim 13, wherein the third vehicle design is generated based on the third location.

15. The one or more non-transitory computer-readable media of claim 14, wherein the style metric indicates a degree to which the first vehicle design differs from a characteristic style associated with the second vehicle design.

16. The one or more non-transitory computer-readable media of claim 15, wherein the third vehicle design includes at least one design feature associated with the characteristic style.

17. The one or more non-transitory computer-readable media of claim 16, wherein generating the third vehicle design comprises:

traversing the latent space representation from the first location to a third location; and increasing a dimensionality associated with the third location to a dimensionality that is greater than or equal to a dimensionality associated with the first vehicle design.

18. The one or more non-transitory computer-readable media of claim 17, wherein increasing the dimensionality associated with the third location comprises performing a deconvolution operation on the third location.

19. The one or more non-transitory computer-readable media of claim 18, projecting the first vehicle design into the latent space representation comprises decreasing a dimensionality associated with the first vehicle design to a dimensionality that is equal to a dimensionality associated with the latent space representation.

20. The one or more non-transitory computer-readable media of claim 19, wherein decreasing the dimensionality associated with the first vehicle design comprises performing a convolution operation on the first vehicle design.

21. the one or more non-transitory computer readable media of claim 12, wherein the first vehicle design comprises a two-dimensional array of pixels.

22. The one or more non-transitory computer-readable media of claim 21, wherein the first vehicle design comprises a set of non-uniform rational B-spline (NURBS) curves.

23. The one or more non-transitory computer-readable media of claim 22, wherein the first vehicle design incudes at least one sensor feature associated with an autonomous vehicle.

24. A system, comprising:

one or more memories that store instructions; and one or more processors that are coupled to the one or more memories and, when executing the instructions, are configured to perform the steps of:

executing an encoder model to project a first vehicle design into a latent space representation of vehicle design features to generate a first location;

executing the encoder model to project a second vehicle design into the latent space representation to generate a second location;

generating a style metric based on the first location and the second location; and generating a third vehicle design based on the style metric.

* * * * *

UNITED STATES PATENT AND TRADEMARK OFFICE
CERTIFICATE OF CORRECTION

PATENT NO. : 11,842,262 B2
APPLICATION NO. : 18/045809
DATED : December 12, 2023
INVENTOR(S) : Danil Nagy et al.

It is certified that error appears in the above-identified patent and that said Letters Patent is hereby corrected as shown below:

In the Claims

Column 14, Claim 21, Line 37, please delete "21. the" and insert --21. The--.

Signed and Sealed this
Twenty-sixth Day of March, 2024

Katherine Kelly Vidal
*Director of the United States Patent and Trademark Office*